USO11158725B2

(12) United States Patent
Yuan et al.

(10) Patent No.: US 11,158,725 B2
(45) Date of Patent: *Oct. 26, 2021

(54) FIN STRUCTURE OF FIN FIELD EFFECT TRANSISTOR

(71) Applicant: Taiwan Semiconductor Manufacturing Company, Ltd., Hsinchu (TW)

(72) Inventors: Feng Yuan, Hsinchu (TW); Hung-Ming Chen, Hsinchu County (TW); Tsung-Lin Lee, Hsinchu (TW); Chang-Yun Chang, Taipei (TW); Clement Hsingjen Wann, Carmel, NY (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 23 days.

This patent is subject to a terminal disclaimer.

(21) Appl. No.: 16/511,719

(22) Filed: Jul. 15, 2019

(65) Prior Publication Data

US 2019/0341473 A1 Nov. 7, 2019

Related U.S. Application Data

(63) Continuation of application No. 15/339,258, filed on Oct. 31, 2016, now Pat. No. 10,355,108, which is a
(Continued)

(51) Int. Cl.
*H01L 29/66* (2006.01)
*H01L 29/78* (2006.01)
(Continued)

(52) U.S. Cl.
CPC ...... *H01L 29/66795* (2013.01); *H01L 21/308* (2013.01); *H01L 29/7851* (2013.01);
(Continued)

(58) Field of Classification Search
CPC .......... H01L 29/66795; H01L 29/7851; H01L 29/7853; H01L 29/785; H01L 21/823431;
(Continued)

(56) References Cited

U.S. PATENT DOCUMENTS 5,177,576 A 1/1993 Kimura et al.
5,581,202 A 12/1996 Yano et al.
(Continued)

FOREIGN PATENT DOCUMENTS

CN 1945829 4/2004
CN 101179046 5/2005
(Continued)

OTHER PUBLICATIONS

Anathan, Hari, et al., "FINFET SRAM—Device and Circuit Design Considerations", Quality Electronic Design, 2004, Proceedings 5th International Symposium (2004); pp. 511-516.
(Continued)

*Primary Examiner* — David Chen
(74) *Attorney, Agent, or Firm* — Haynes and Boone, LLP

(57) ABSTRACT

The fin structure includes a first portion and a second, lower portion separated at a transition. The first portion has sidewalls that are substantially perpendicular to the major surface of the substrate. The lower portion has tapered sidewalls on opposite sides of the upper portion and a base having a second width larger than the first width.

20 Claims, 16 Drawing Sheets

Related U.S. Application Data continuation of application No. 12/766,233, filed on Apr. 23, 2010, now Pat. No. 9,484,462.

(60) Provisional application No. 61/245,485, filed on Sep. 24, 2009.

(51) Int. Cl.
*H01L 21/308* (2006.01)
*H01L 21/3065* (2006.01)

(52) U.S. Cl.
CPC ...... *H01L 29/7853* (2013.01); *H01L 21/3065* (2013.01); *H01L 29/66621* (2013.01)

(58) Field of Classification Search
CPC ........... H01L 29/42392; H01L 29/7854; H01L 2029/7858; H01L 21/308; H01L 21/3065
USPC ........ 438/157, 164, 283, 700; 257/330, 401, 257/623, E21.621
See application file for complete search history.

(56) References Cited

U.S. PATENT DOCUMENTS

| | | |
|---|---|---|
| 5,658,417 A | 8/1997 | Watanabe et al. |
| 5,767,732 A | 6/1998 | Lee et al. |
| 5,963,789 A | 10/1999 | Tsuchiaki |
| 6,065,481 A | 5/2000 | Fayfield et al. |
| 6,121,786 A | 9/2000 | Yamagami et al. |
| 6,173,365 B1 | 1/2001 | Chang et al. |
| 6,299,724 B1 | 10/2001 | Fayfield et al. |
| 6,503,794 B1 | 1/2003 | Watanabe et al. |
| 6,613,634 B2 | 9/2003 | Ootsuka et al. |
| 6,622,738 B2 | 9/2003 | Scovell |
| 6,642,090 B1 | 11/2003 | Fried et al. |
| 6,706,571 B1 | 3/2004 | Yu et al. |
| 6,727,557 B2 | 4/2004 | Takao |
| 6,740,247 B1 | 5/2004 | Han et al. |
| 6,743,673 B2 | 6/2004 | Watanabe et al. |
| 6,762,448 B1 | 7/2004 | Lin et al. |
| 6,791,155 B1 | 9/2004 | Lo et al. |
| 6,828,646 B2 | 12/2004 | Marty et al. |
| 6,830,994 B2 | 12/2004 | Mitsuki et al. |
| 6,858,478 B2 | 2/2005 | Chau et al. |
| 6,872,647 B1 | 3/2005 | Yu et al. |
| 6,940,747 B1 | 9/2005 | Sharma et al. |
| 6,949,768 B1 | 9/2005 | Anderson et al. |
| 6,964,832 B2 | 11/2005 | Moniwa et al. |
| 7,009,273 B2 | 3/2006 | Inoh et al. |
| 7,018,901 B1 | 3/2006 | Thean et al. |
| 7,026,232 B1 | 4/2006 | Koontz et al. |
| 7,067,400 B2 | 6/2006 | Bedell et al. |
| 7,078,312 B1 | 7/2006 | Sutanto et al. |
| 7,084,079 B2 | 8/2006 | Conti et al. |
| 7,084,506 B2 | 8/2006 | Takao |
| 7,112,495 B2 | 9/2006 | Ko et al. |
| 7,153,744 B2 | 12/2006 | Chen et al. |
| 7,157,351 B2 | 1/2007 | Cheng et al. |
| 7,190,050 B2 | 3/2007 | King et al. |
| 7,193,399 B2 | 3/2007 | Aikawa |
| 7,247,887 B2 | 7/2007 | King et al. |
| 7,265,008 B2 | 9/2007 | King et al. |
| 7,265,418 B2 | 9/2007 | Yun et al. |
| 7,298,600 B2 | 11/2007 | Oh et al. |
| 7,300,837 B2 | 11/2007 | Chen et al. |
| 7,315,994 B2 | 1/2008 | Aller et al. |
| 7,323,375 B2 | 1/2008 | Yoon et al. |
| 7,338,614 B2 | 3/2008 | Martin et al. |
| 7,351,662 B2 | 4/2008 | Siddiqui et al. |
| 7,358,166 B2 | 4/2008 | Agnello et al. |
| 7,361,563 B2 | 4/2008 | Shin et al. |
| 7,374,986 B2 | 5/2008 | Kim et al. |
| 7,394,116 B2 | 7/2008 | Kim et al. |
| 7,396,710 B2 | 7/2008 | Okuno |
| 7,407,847 B2 | 8/2008 | Doyle et al. |
| 7,410,844 B2 | 8/2008 | Li et al. |
| 7,425,740 B2 | 9/2008 | Liu et al. |
| 7,442,956 B2 | 10/2008 | Ko et al. |
| 7,456,087 B2 | 11/2008 | Cheng |
| 7,494,862 B2 | 2/2009 | Doyle et al. |
| 7,508,031 B2 | 3/2009 | Liu et al. |
| 7,528,465 B2 | 5/2009 | King et al. |
| 7,534,689 B2 | 5/2009 | Pal et al. |
| 7,538,387 B2 | 5/2009 | Tsai |
| 7,550,332 B2 | 6/2009 | Yang |
| 7,598,145 B2 | 10/2009 | Damiencourt et al. |
| 7,605,449 B2 | 10/2009 | Liu et al. |
| 7,682,911 B2 | 3/2010 | Jang et al. |
| 7,759,228 B2 | 7/2010 | Sugiyama et al. |
| 7,795,097 B2 | 9/2010 | Pas |
| 7,798,332 B1 | 9/2010 | Brunet |
| 7,820,513 B2 | 10/2010 | Hareland et al. |
| 7,851,865 B2 | 12/2010 | Anderson et al. |
| 7,868,317 B2 | 1/2011 | Yu et al. |
| 7,898,041 B2 | 3/2011 | Radosavljevic et al. |
| 7,923,321 B2 | 4/2011 | Lai et al. |
| 7,923,339 B2 | 4/2011 | Meunier-Beillard et al. |
| 7,960,791 B2 | 6/2011 | Anderson et al. |
| 7,985,633 B2 | 7/2011 | Cai et al. |
| 7,989,846 B2 | 8/2011 | Furuta |
| 7,989,855 B2 | 8/2011 | Narihiro |
| 8,003,466 B2 | 8/2011 | Shi et al. |
| 8,043,920 B2 | 10/2011 | Chan et al. |
| 8,076,189 B2 | 12/2011 | Grant |
| 8,101,475 B2 | 1/2012 | Oh et al. |
| 2003/0080361 A1 | 5/2003 | Murthy et al. |
| 2003/0109086 A1 | 6/2003 | Arao |
| 2004/0075121 A1 | 4/2004 | Yu et al. |
| 2004/0119170 A1 | 6/2004 | Kim et al. |
| 2004/0129998 A1 | 7/2004 | Inoh et al. |
| 2004/0192067 A1 | 9/2004 | Ghyselen et al. |
| 2004/0219722 A1 | 11/2004 | Pham et al. |
| 2004/0259315 A1 | 12/2004 | Sakaguchi et al. |
| 2005/0020020 A1 | 1/2005 | Collaert et al. |
| 2005/0035391 A1 | 2/2005 | Lee et al. |
| 2005/0051865 A1 | 3/2005 | Lee et al. |
| 2005/0082616 A1 | 4/2005 | Chen et al. |
| 2005/0153490 A1 | 7/2005 | Yoon et al. |
| 2005/0170593 A1 | 8/2005 | Kang et al. |
| 2005/0212080 A1 | 9/2005 | Wu et al. |
| 2005/0221591 A1 | 10/2005 | Bedell et al. |
| 2005/0224800 A1 | 10/2005 | Lindert et al. |
| 2005/0233598 A1 | 10/2005 | Jung et al. |
| 2005/0266698 A1 | 12/2005 | Coney et al. |
| 2005/0280102 A1 | 12/2005 | Oh et al. |
| 2006/0038230 A1 | 2/2006 | Ueno et al. |
| 2006/0068553 A1 | 3/2006 | Thean et al. |
| 2006/0073662 A1 | 4/2006 | Jang et al. |
| 2006/0091481 A1 | 5/2006 | Li et al. |
| 2006/0091482 A1 | 5/2006 | Kim et al. |
| 2006/0091937 A1 | 5/2006 | Do |
| 2006/0105557 A1 | 5/2006 | Klee et al. |
| 2006/0128071 A1 | 6/2006 | Rankin et al. |
| 2006/0138572 A1 | 6/2006 | Arikado et al. |
| 2006/0151808 A1 | 7/2006 | Chen et al. |
| 2006/0153995 A1 | 7/2006 | Narwankar et al. |
| 2006/0166475 A1 | 7/2006 | Manti |
| 2006/0214212 A1 | 9/2006 | Horita et al. |
| 2006/0258156 A1 | 11/2006 | Kittl et al. |
| 2007/0001173 A1 | 1/2007 | Brask et al. |
| 2007/0004218 A1 | 1/2007 | Lee et al. |
| 2007/0015334 A1 | 1/2007 | Kittl et al. |
| 2007/0020827 A1 | 1/2007 | Buh et al. |
| 2007/0024349 A1 | 2/2007 | Tsukude |
| 2007/0029576 A1 | 2/2007 | Nowak et al. |
| 2007/0048907 A1 | 3/2007 | Lee et al. |
| 2007/0076477 A1 | 4/2007 | Hwang et al. |
| 2007/0093010 A1 | 4/2007 | Mathew et al. |
| 2007/0093036 A1 | 4/2007 | Cheng et al. |
| 2007/0096148 A1 | 5/2007 | Hoentschel et al. |
| 2007/0102756 A1* | 5/2007 | Lojek ................ H01L 29/66795 257/327 |
| 2007/0120156 A1 | 5/2007 | Liu et al. |
| 2007/0122953 A1 | 5/2007 | Liu et al. |

(56) References Cited

U.S. PATENT DOCUMENTS

| | | |
|---|---|---|
| 2007/0122954 A1 | 5/2007 | Liu et al. |
| 2007/0128782 A1 | 6/2007 | Liu et al. |
| 2007/0132053 A1 | 6/2007 | King et al. |
| 2007/0145487 A1 | 6/2007 | Kavalieros et al. |
| 2007/0152276 A1 | 7/2007 | Arnold et al. |
| 2007/0166929 A1 | 7/2007 | Matsumoto et al. |
| 2007/0178637 A1 | 8/2007 | Jung et al. |
| 2007/0221956 A1 | 9/2007 | Inaba |
| 2007/0236278 A1 | 10/2007 | Hur et al. |
| 2007/0241414 A1 | 10/2007 | Narihiro |
| 2007/0247906 A1 | 10/2007 | Watanabe et al. |
| 2007/0254440 A1 | 11/2007 | Daval |
| 2008/0001171 A1 | 1/2008 | Tezuka et al. |
| 2008/0023754 A1 | 1/2008 | Baek |
| 2008/0036001 A1 | 2/2008 | Yun et al. |
| 2008/0042209 A1 | 2/2008 | Tan et al. |
| 2008/0050882 A1 | 2/2008 | Bevan et al. |
| 2008/0085580 A1 | 4/2008 | Doyle et al. |
| 2008/0085590 A1 | 4/2008 | Yao et al. |
| 2008/0095954 A1 | 4/2008 | Gabelnick et al. |
| 2008/0102586 A1 | 5/2008 | Park |
| 2008/0124878 A1 | 5/2008 | Cook et al. |
| 2008/0157225 A1 | 7/2008 | Datta et al. |
| 2008/0171416 A1* | 7/2008 | Fang ................ H01L 27/11568 438/257 |
| 2008/0227241 A1 | 9/2008 | Nakabayashi et al. |
| 2008/0265344 A1 | 10/2008 | Mehrad et al. |
| 2008/0290470 A1 | 11/2008 | King et al. |
| 2008/0296632 A1 | 12/2008 | Moroz et al. |
| 2008/0299734 A1 | 12/2008 | Lee et al. |
| 2008/0318392 A1 | 12/2008 | Hung et al. |
| 2009/0026540 A1 | 1/2009 | Sasaki et al. |
| 2009/0039388 A1 | 2/2009 | Teo et al. |
| 2009/0066763 A1 | 3/2009 | Fujii et al. |
| 2009/0087960 A1 | 4/2009 | Cho et al. |
| 2009/0111239 A1 | 4/2009 | Kim |
| 2009/0155969 A1 | 6/2009 | Chakravarti et al. |
| 2009/0166625 A1 | 7/2009 | Ting et al. |
| 2009/0181477 A1 | 7/2009 | King et al. |
| 2009/0200612 A1 | 8/2009 | Koldiaev |
| 2009/0239347 A1 | 9/2009 | Ting et al. |
| 2009/0321836 A1 | 12/2009 | Wei et al. |
| 2010/0025806 A1 | 2/2010 | Cho et al. |
| 2010/0155790 A1 | 6/2010 | Lin et al. |
| 2010/0155848 A1* | 6/2010 | Pillarisetty .............. H01L 27/11 257/368 |
| 2010/0163926 A1 | 7/2010 | Hudait et al. |
| 2010/0187613 A1 | 7/2010 | Colombo et al. |
| 2010/0207211 A1 | 8/2010 | Sasaki et al. |
| 2010/0308379 A1 | 12/2010 | Kuan et al. |
| 2011/0018065 A1 | 1/2011 | Curatola et al. |
| 2011/0108920 A1 | 5/2011 | Basker et al. |
| 2011/0129990 A1 | 6/2011 | Mandrekar et al. |
| 2011/0195555 A1 | 8/2011 | Tsai et al. |
| 2011/0195570 A1 | 8/2011 | Lin et al. |
| 2011/0256682 A1 | 10/2011 | Yu et al. |
| 2012/0086053 A1 | 4/2012 | Tseng et al. |

FOREIGN PATENT DOCUMENTS

| | | |
|---|---|---|
| CN | 1011459116 | 6/2009 |
| JP | 2005064500 | 3/2005 |
| JP | 2005528810 | 9/2005 |
| JP | 2007-194336 | 8/2007 |
| JP | 2009054705 | 3/2009 |
| KR | 1020070064231 | 6/2007 |
| KR | 10-2005-0119424 | 12/2008 |
| TW | 497253 | 8/2002 |
| WO | WO2007/115585 | 10/2007 |

OTHER PUBLICATIONS

Jha, Niraj, Low-Power FINFET Circuit Design, Dept. of Electrical Engineering, Princeton University N.D.

Kedzierski, J., et al., "Extension and Source/Drain Design for High-Performance FINFET Devices", IEEE Transactions on Electron Devices, vol. 50, No. 4, Apr. 2003, pp. 952-958.

Liow, Tsung-Yang et al., "Strained N-Channel FINFETS With 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

Quirk et al., Semiconductor Manufacturing Technology, Oct. 2001, Prentice Hall, Chapter 16.

McVittie, James P., et al., "Speedie: a Profile Simulator for Etching and Deposition", Proc. SPIE 1392, 126 (1991).

90 nm Technology retrieved from the internet <URL.http://tsmc.com/english/dedicatedFoundry/technology/90nm.htm.

Merriam Webster Definition of Substantially Retrieved from the internet URL:http://www.merriam-webster.com/.

Smith, Casey Eben, Advanced Technology for Source Drain Resistence, Diss. University of North Texas, 2008.

Liow, Tsung-Yang et al., "Strained N-Channel FINFETS Featuring in Situ Doped Silicon-Carbon Sl1-Ycy Source Drain Stressors With High Carbon Content", IEEE Transactions on Electron Devices 55.9 (2008): 2175-483.

Office Action dated Mar. 28, 2012 from corresponding application No. CN 201010228334.6.

Notice of Decision on Patent dated Mar. 12, 2012 from corresponding application No. 10-2010-0072103.

OA dated Mar. 27, 2012 from corresponding application No. KR10-2010-0094454.

OA dated Mar. 29, 2012 from corresponding application No. KR10-2010-0090264.

Office Action dated May 2, 2012 from corresponding application No. CN 201010196345.0.

Office Action dated May 4, 2012 from corresponding application No. CN 201010243667.6.

Office Action dated Oct. 30, 2013 from corresponding application No. KR 10-2010-0090264 with English Translation.

Office Action dated Jan. 14, 2013 from corresponding application No. CN 201010288100.0.

Office Action dated Jan. 8, 2013 from corresponding application No. JP 2010-214031.

* cited by examiner

FIN STRUCTURE OF FIN FIELD EFFECT TRANSISTOR

CROSS-REFERENCE TO RELATED APPLICATIONS

The present application is a continuation application of U.S. application Ser. No. 15/339,258 filed Oct. 31, 2016, which is a continuation application of U.S. application Ser. No. 12/766,233, filed Apr. 23, 2010, now U.S. Pat. No. 9,484,462, titled FIN STRUCTURE OF FIN FIELD EFFECT TRANSISTOR, which claims priority of U.S. Provisional Patent Application Ser. No. 61/245,485, filed on Sep. 24, 2009. The disclosures of each of which are incorporated by reference in their entirety.

In addition, this application is also related to U.S. patent application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES, which are incorporated herein by reference in their entirety.

TECHNICAL FIELD

The present invention relates generally to transistors, and more particularly to a fin field effect transistor with an isolation structure.

BACKGROUND

Semiconductor devices are used in a large number of electronic devices, such as computers, cell phones, and others. Semiconductor devices comprise integrated circuits (ICs) that are formed on semiconductor wafers by depositing many types of thin films of material over the semiconductor wafers, and patterning the thin films of material to form the integrated circuits. The ICs include field-effect transistors (FETs), such as metal-oxide-semiconductor field-effect transistors (MOSFETs).

One of the goals of the semiconductor industry is to continue shrinking the size and increasing the speed of individual MOSFETs. To achieve these goals, three dimensional (3-D) or non-planar transistor structures such as fin FETs (FINFETs), multiple gate transistors, or gate-all-around transistors are being investigated for use in sub 22 nm transistor nodes. Such transistors not only improve area density, but also improve gate control of the channel.

However, fabrication of the FINFETs is complex and requires overcoming a number of challenging problems. One of the challenges is forming recess-free isolation structures. These recesses can be formed in a dielectric material in the early stages of forming the isolation structure. FIGS. 1A-C show cross-sectional views of a plurality of conventional isolation structures 120 for FINFETs 100 having recesses 126b present in the isolation structures 120 at various stages of fabrication. FIG. 1A illustrates the plurality of isolation structures 120 may be formed by etching a substrate 102 to form a plurality of trenches 122 separating a plurality of fin structures 110, then filling the plurality of trenches 122 with a dielectric material 124 (shown in FIG. 1B), such as high-density plasma (HDP) oxides, tetraethoxysilane (TEOS) oxides, or the like. The dielectric material 124 may comprise a plurality of deep slims/recesses 126a due to the high aspect ratio of the plurality of trenches 122. FIG. 1C shows a plurality of recesses 126b in the plurality of isolation structures 120 may be formed along the plurality of deep slims/recesses 126a during and after removing the upper portions of the dielectric material 124. The plurality of recesses 126b is problematic in various respects. For example, the plurality of recesses 126b present in the plurality of isolation structures 120 can become a receptacle of polysilicon and/or metals during subsequent processing thereby increasing the likelihood of device instability and/or device failure.

Accordingly, what is needed is an isolation structure for a FINFET having no recess.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3A-D shows a complete FINFET device having a plurality of isolation structures fabricated using the steps shown in FIG. 2A-H, wherein FIG. 3A shows a perspective view, and wherein FIGS. 3B-D show cross-section views taken along the respective lines of FIG. 3A.

DESCRIPTION

Figure 1A:
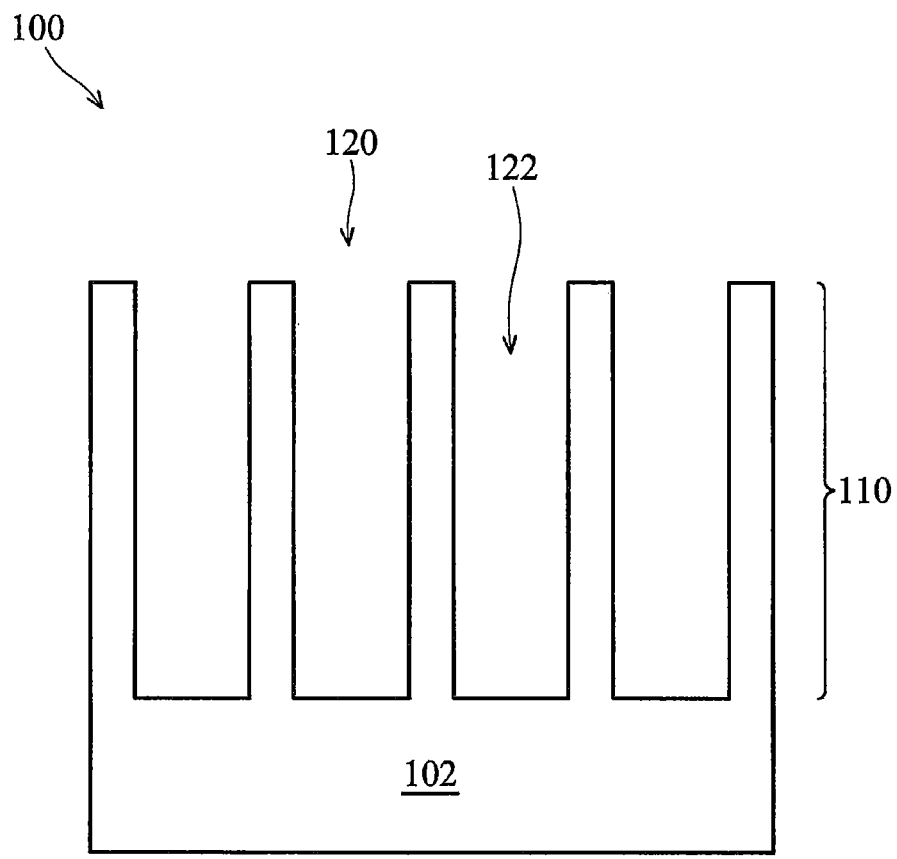
FIGS. 1A-C show cross-sectional views of a plurality of conventional isolation structures for FINFETs having recesses present in the isolation structures at various stages of fabrication.
Figure 1B:
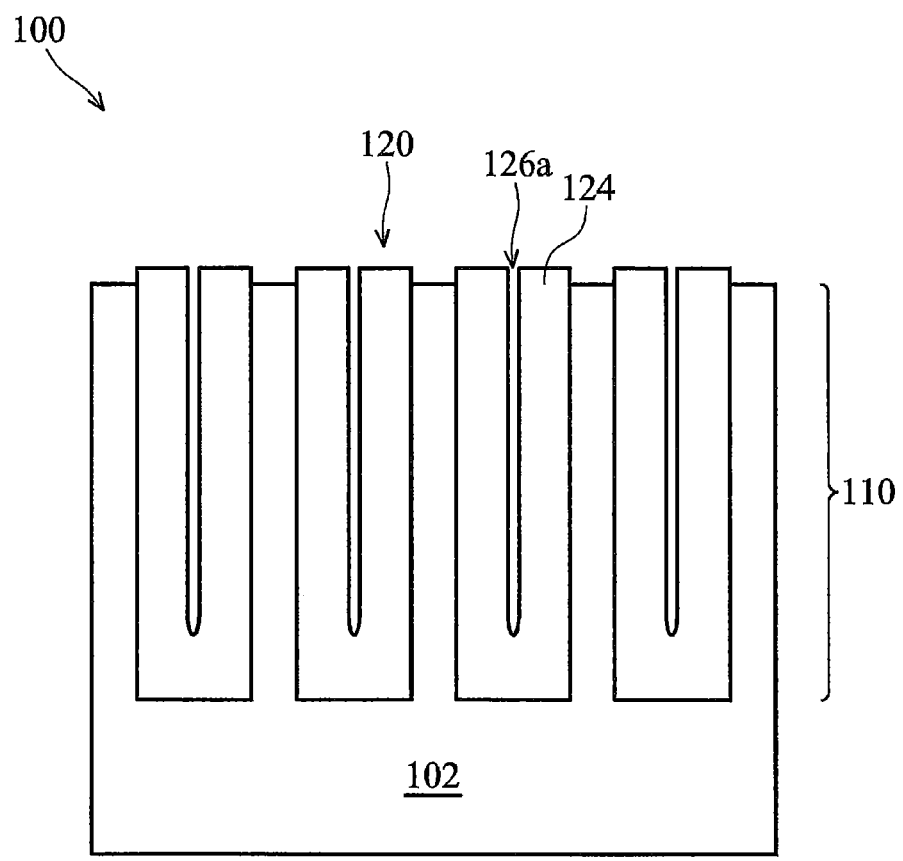
Figure 1C:
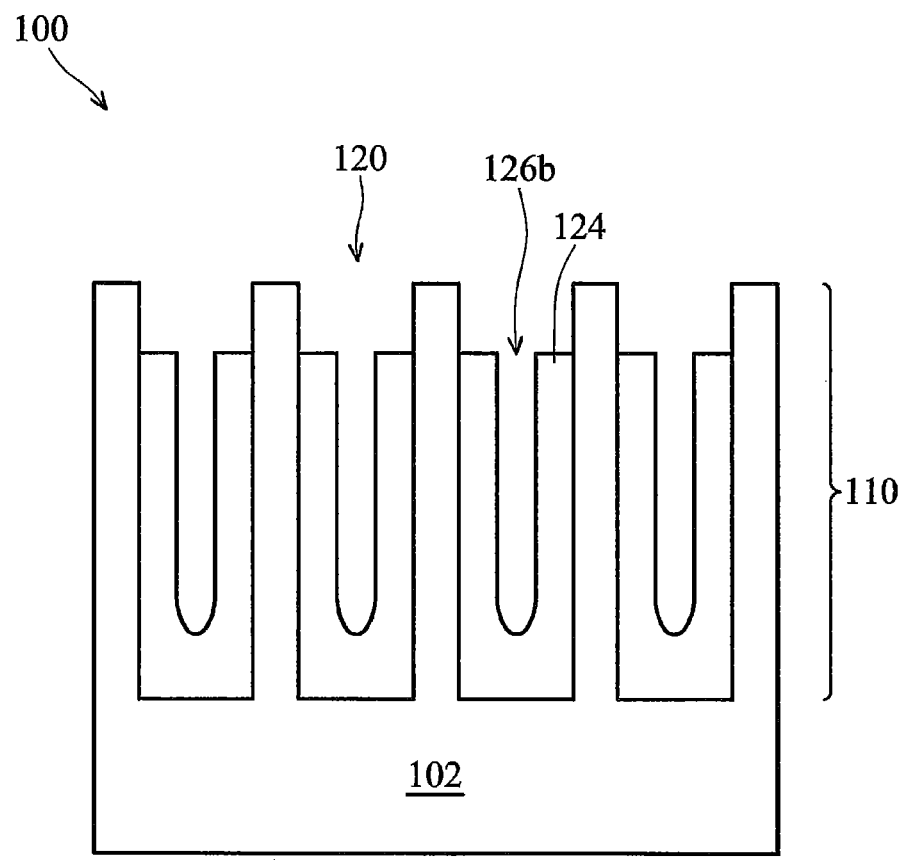

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the purpose of simplicity and clarity.

Figure 2A:
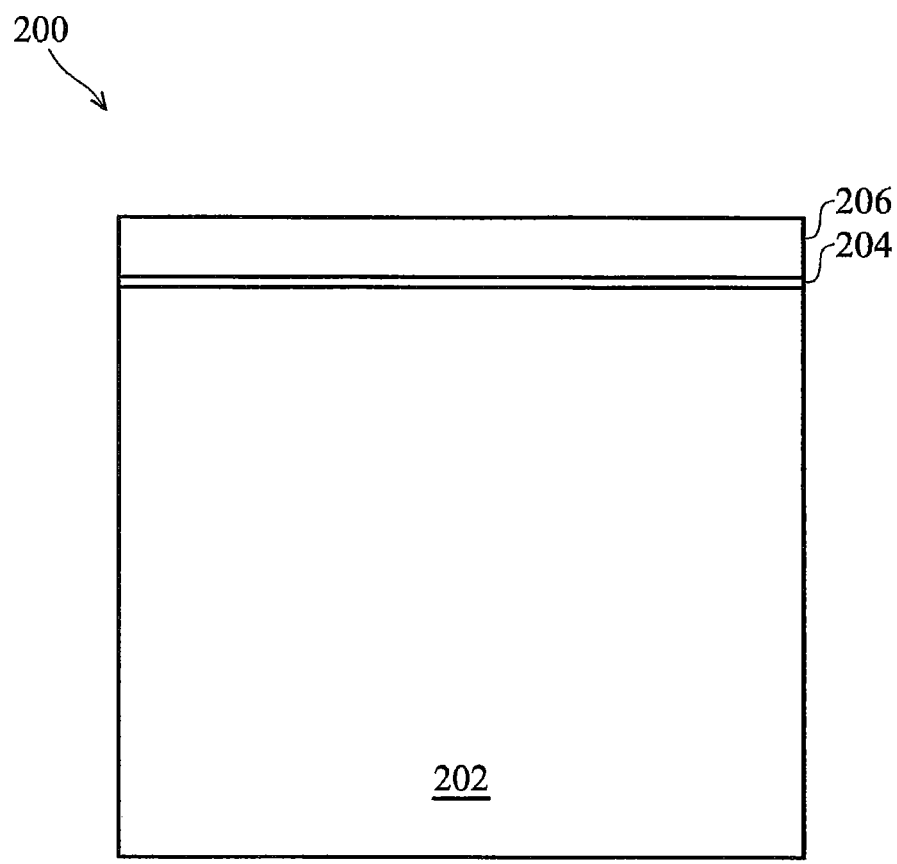
FIGS. 2A-H show schematic cross-sectional views of a substrate being processed to fabricate a plurality of FINFETs according to an embodiment, showing various stages of fabrication.
Figure 2B:
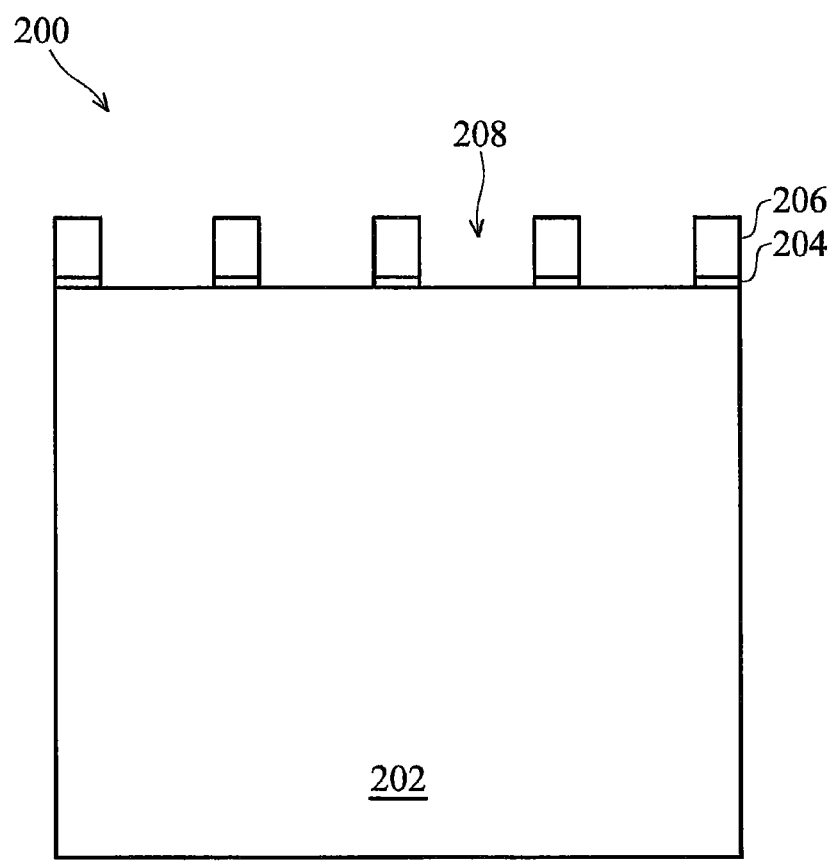
Figure 2C:
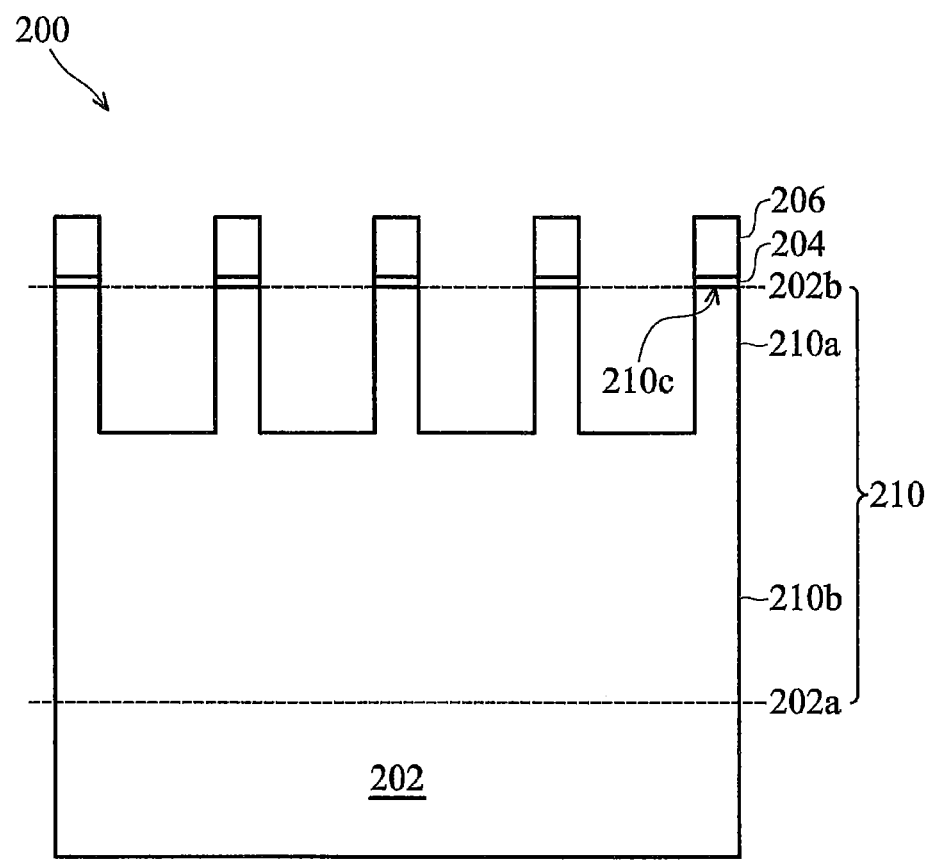
Figure 2D:
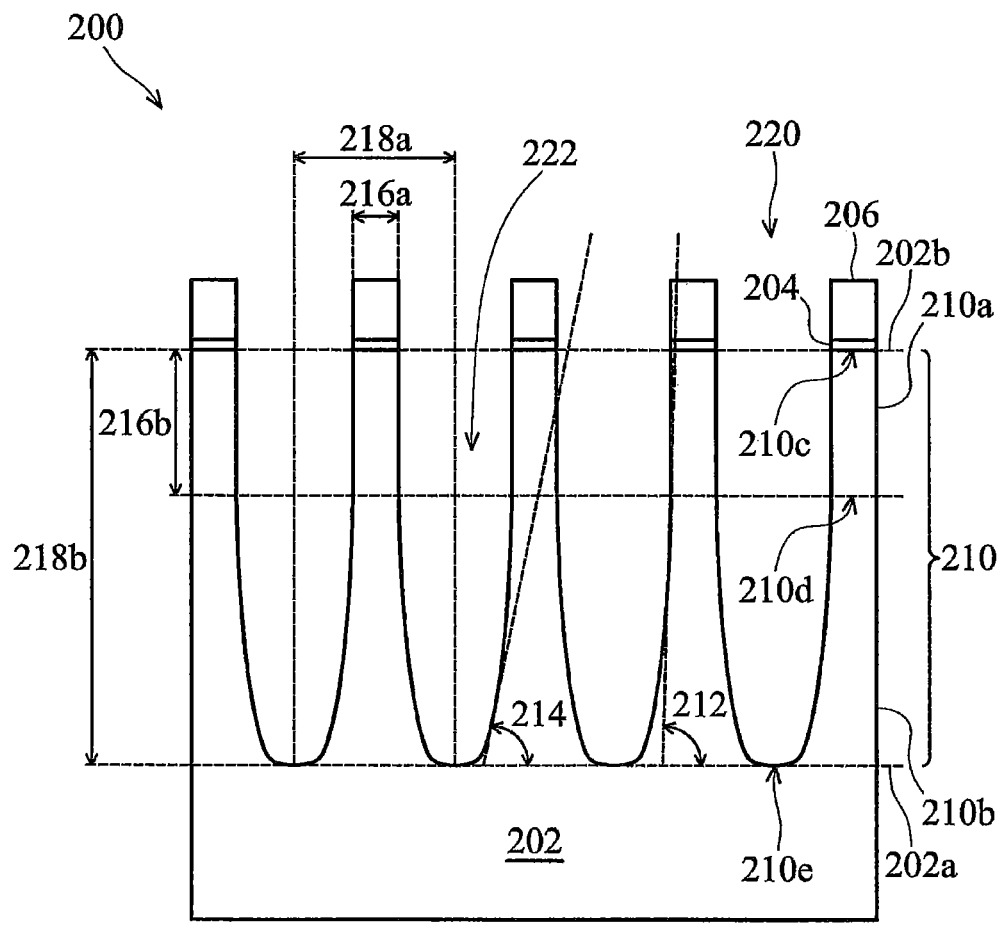
Figure 2E:
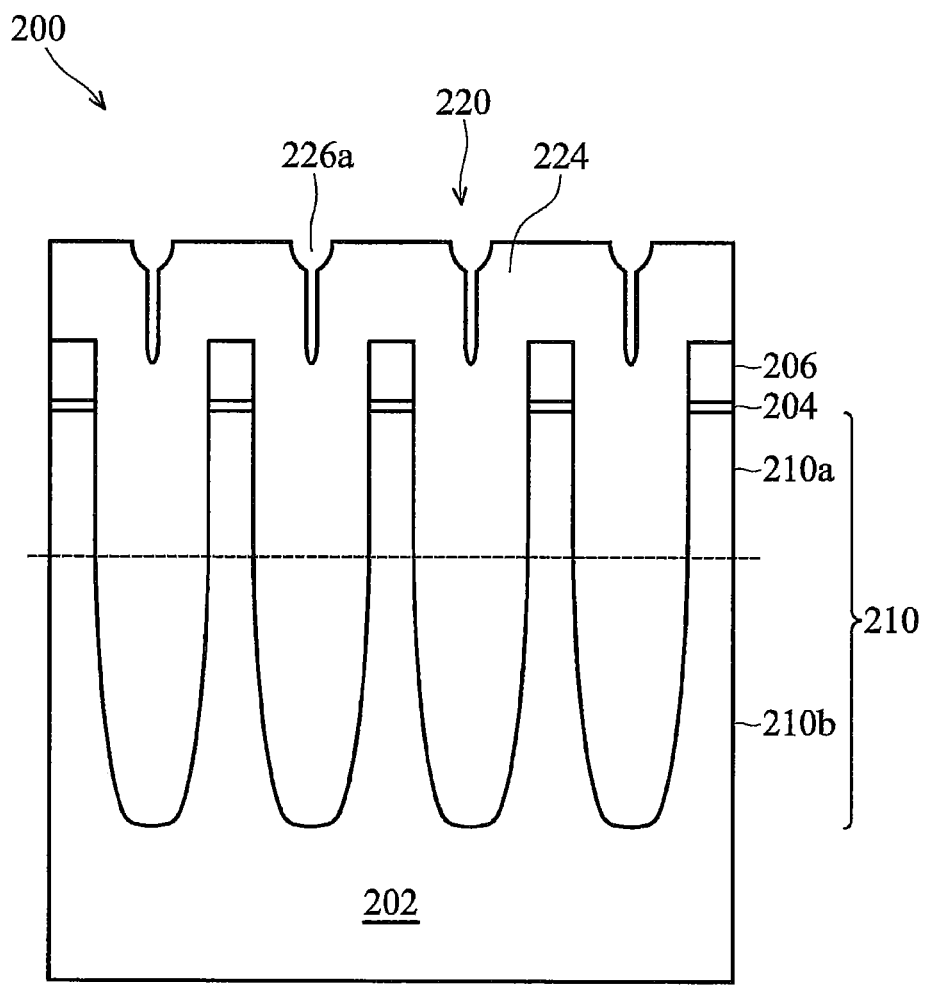
Figure 2F:
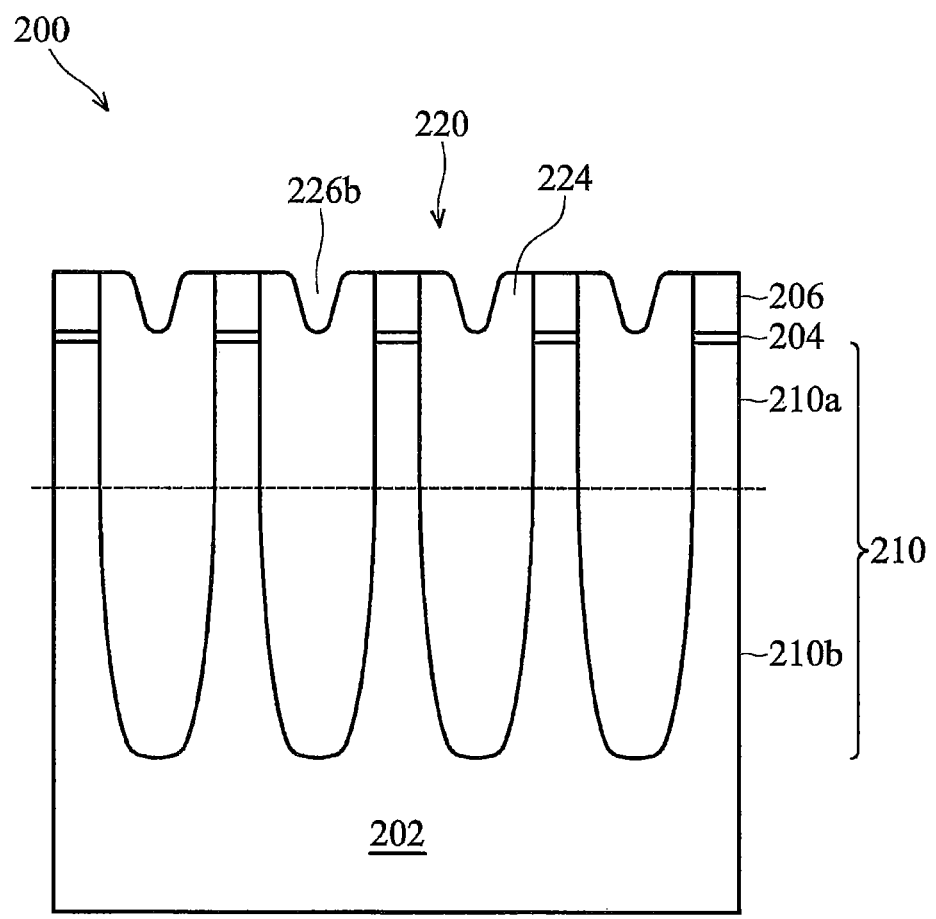
Figure 2G:
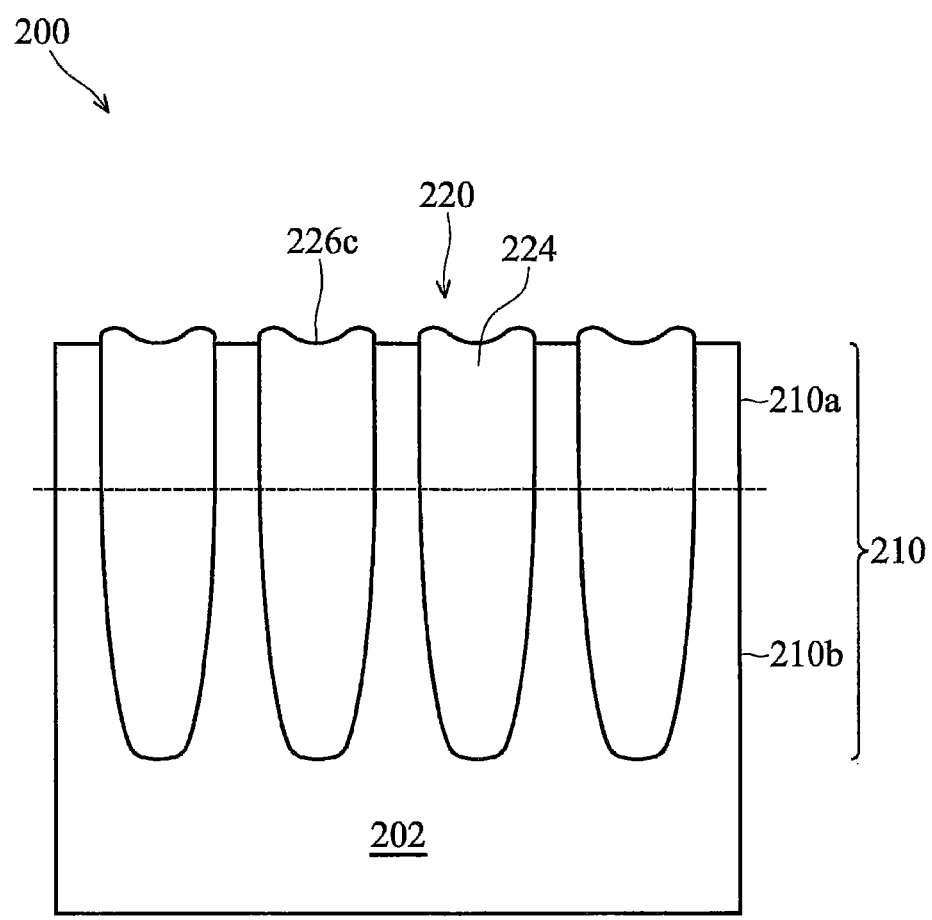
Figure 2H:
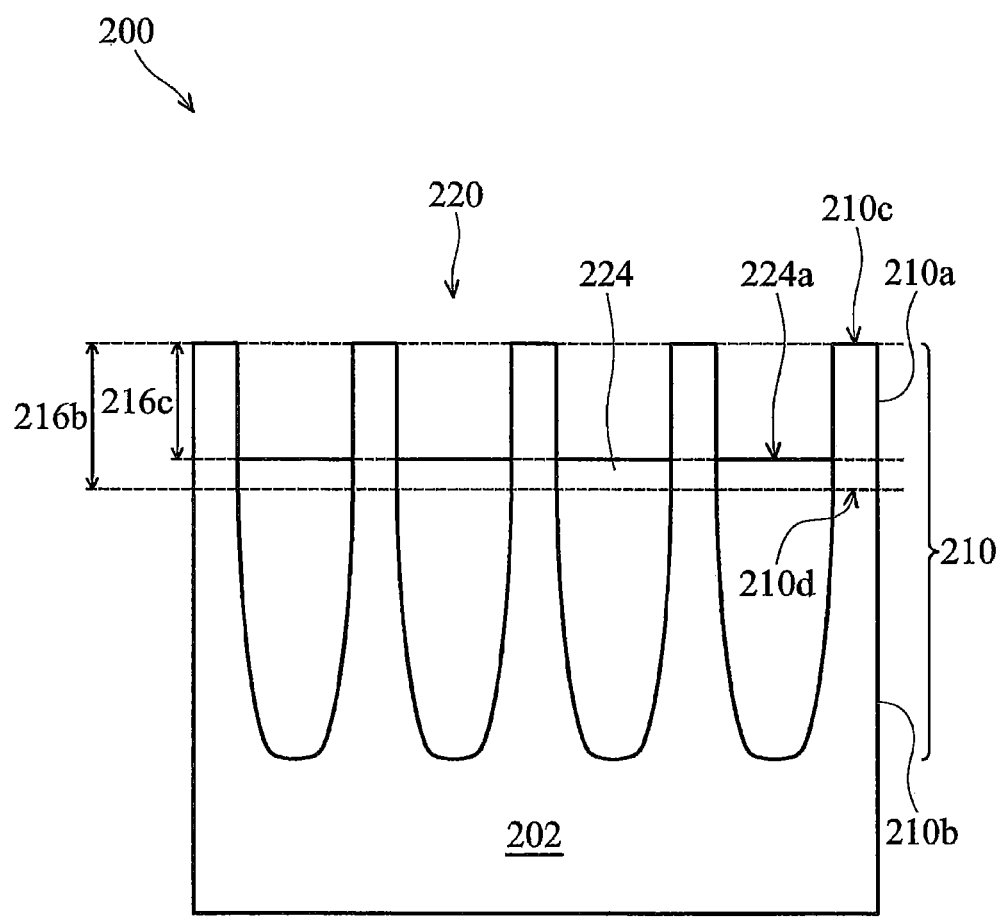
Figure 2I:
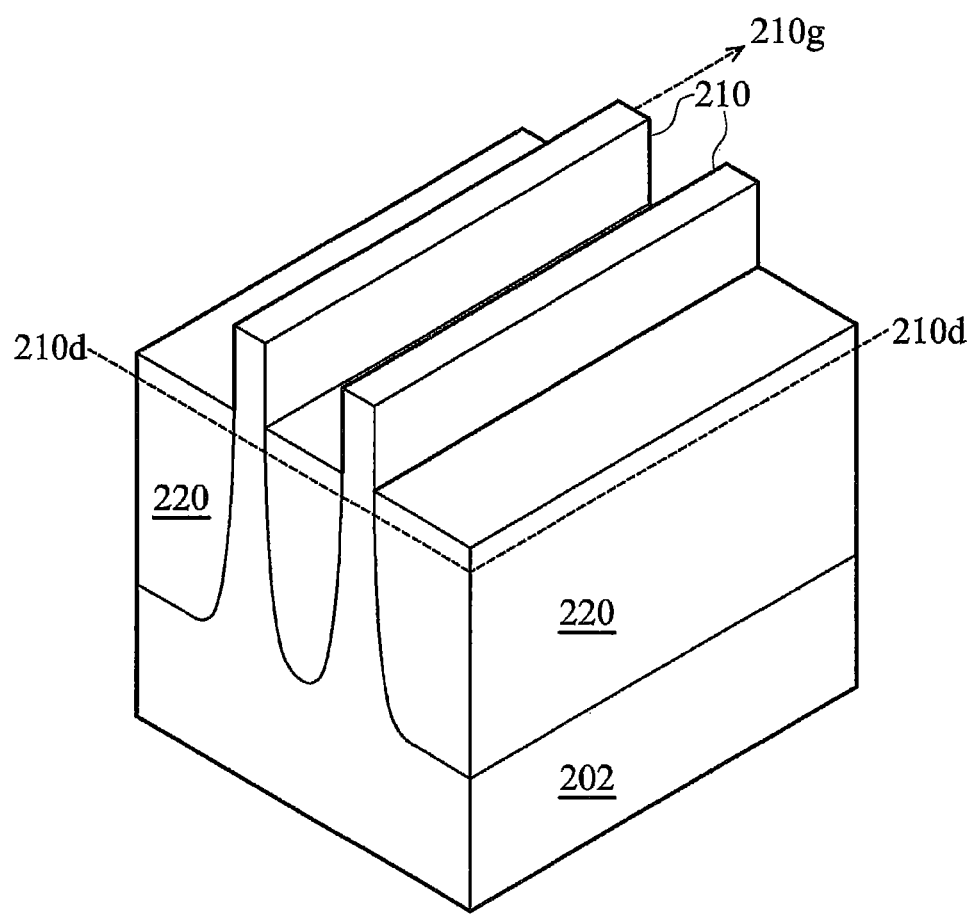
FIG. 2I shows a perspective view of the plurality of the FINFETs fabricated using the steps shown in FIG. 2A-H.

FIGS. 2A-H show schematic cross-sectional views of a substrate being processed to fabricate a plurality of FINFETs according to an embodiment, showing various stages of fabrication, and FIG. 2I shows a perspective view of the plurality of the FINFETs fabricated using the steps shown in FIG. 2A-H. It is understood that part of the FINFETs 200 may be fabricated with normal complementary metal-oxide-semiconductor (CMOS) technology processes, and thus some processes are briefly described herein. Also, FIGS. 2A-H are simplified for a better understanding of the inventive concepts of the present disclosure. For example, although the figures illustrate the FINFET 200, it is understood the ICs may also include a number of various devices including resistors, capacitors, inductors, fuses, etc.

Referring to FIG. 2A, the FINFETs 200 may include a semiconductor substrate 202 such as a silicon substrate. In some embodiments, the substrate 202 may alternatively include silicon germanium, gallium arsenic, or other suitable semiconductor materials. The substrate 202 may further include other features such as various doped regions, a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate 202 may include a multilayer silicon structure or a silicon substrate 202 may include a multilayer compound semiconductor structure.

Still referring to FIG. 2A, a pad oxide layer 204 is formed over the top surface of the substrate 202. In some embodiments, the pad oxide layer 204 is preferably formed of silicon oxide grown by a thermal oxidation process, having a thickness of about 80 to 150 Å. For example, the pad oxide layer 204 can be grown by the rapid thermal oxidation (RTO) process or in an annealing process, which include oxygen. A hardmask layer 206, for example a silicon nitride or silicon oxynitride layer, is formed over the pad oxide layer 204. The hardmask layer 206 can be deposited by, for example, a chemical vapor deposition (CVD) process, or a low pressure CVD (LPCVD) process. Preferably, in some embodiments, the formed hardmask layer 206 has a thickness of about 600 to 1500 Å.

Referring to FIG. 2B, following formation of the hardmask layer 206, a patterned photo-sensitive layer (not shown) is formed on the hardmask layer 206. A reactive ion etching (RIE) or a high density plasma (HDP) process may, for example, be used to anisotropically etch through the hardmask layer 206 and the pad oxide layer 204 to form openings 208 in the hardmask layer 206 and the pad oxide layer 204, exposing a portion of the substrate 202.

Referring to FIG. 2C, upper portions 210a of a plurality of fin structures 210 protruding from the major surface 202a of the substrate 202 may be formed by etching the substrate 202 using a first etch process. For example, the first etch process may be performed under a source power of about 550 to 650 W, a bias power of about 55 to 65 W, and a pressure of about 2 to 10 mTorr, using CH2F2, SF6, N2, and He as etching gases. The substrate 202 comprises a major surface 202a parallel to a substrate surface 202b. The upper portion 210a of each fin structure 210 has sidewalls that are substantially perpendicular to the major surface 202a of the substrate 202 and a top surface 210c.

Referring to FIG. 2D, lower portions 210b of the plurality of fin structures 210 protruding from the major surface 202a of the substrate 202 may be formed by further etching the substrate 202 using a second etch process. For example, the second etch process may be performed under a source power of about 1100 to 1250 W, a bias power of about 200 to 220 W, and a pressure of about 10 to 20 mTorr, using HBr, SF6, and He as etching gases. The upper portion 210a and the lower portion 210b of each fin structure 210 are separated at a transition location 210d at, in some embodiments, where the sidewall of the fin structure at an angle 212 of 85 degrees to the major surface 202a of the substrate 202. The lower portion 210b of each fin structure 210 has tapered sidewalls on opposite sides of the upper portion 210a and a base 210e. In some embodiments, the tapered regions of the lower portion 210b of each fin structure 210 is preferably at an angle 214 in the range of 60 degrees to 85 degrees to the major surface 202a of the substrate 202. In one embodiment, a plurality of trenches 222 formed between the tapered fin structures 210 have lower aspect ratio than the plurality of trenches 122 formed between the vertical fin structures 110. The lower aspect-ratio trenches 222 have better gap-fill performance than the higher aspect-ratio trenches 122.

Still referring to FIG. 2D, the top surface 210c of the upper portion 210a of each fin structure 210 having a first width 216a, the first width 216a is in the range of about 5 to 40 nanometers. In one embodiment, the base 210e of the lower portion 210b of each fin structure 210 having a second width 218a, the second width 218a is in the range of about 10 to 60 nanometers. In some embodiments, a ratio of the first width 216a to the second width 218a is preferably from 0.3 to 0.5.

Still referring to FIG. 2D, in some embodiments, a first offset distance 216b between the transition location 210d and the top surface 210c is in the range of about 40 to 100 nanometers. In some embodiments, a second offset distance 218b between the base 210e and the top surface 210c is in the range of about 100 to 300 nanometers. A ratio of the first offset distance 216b between the transition location 210d and the top surface 210c to the second offset distance 218b between the base 210e and the top surface 210c, in some embodiments, is preferably from 0.15 to 0.3.

Referring to FIG. 2E, following formation of the plurality of the fin structures 210, the plurality of the isolation structures 220 between the fin structures 210 may be formed in the plurality of the trenches 222. In some embodiments, a liner layer (not shown) may be formed substantially conformal over the substrate 202, including along the sidewalls of the plurality of the trenches 222. The liner layer is a dielectric layer (e.g., an oxide layer, nitride layer, oxynitride layer or combination thereof) formed by a thermal oxidation process or CVD process. Preferably, the liner layer may have a thickness of about 30 to 200 Å. In some embodiments, the liner layer is provided for reducing damage on the surface of the fin structures 210 created by the trench-etch process as set forth above. In some embodiments, the liner layer is not used.

Still referring to FIG. 2E, following formation of the liner layer, a dielectric material 224 is formed over the liner layer to a sufficient thickness within and above the plurality of the trenches 222. For example, the dielectric material 224 is preferably deposited to a thickness from the base 210e of 4000 to 8000 Å. In one embodiment, the dielectric material 224 can be formed using a CVD process, such as HDP CVD process or sub-atmospheric CVD (SACVD) process. For example, the dielectric material 224 comprises HDP-CVD oxide layer. The dielectric material 224 can be deposited under a low frequency power less than 5000 W, a high frequency power less than 3500 W, a pressure less than 10 mTorr and a temperature of about 500 to 1000° C., using silane and oxygen as reacting precursors. For another example, the dielectric material 224 comprises a sub-atmospheric undoped-silicon glass (SAUSG) layer. The dielectric material 224 can be deposited under a pressure of about 500 to 700 torr and a temperature of about 500 to 600° C., using tetraethoxysilane (TEOS) and 03 as reacting precursors. The dielectric material 224 may comprise a plurality of shallow slims/recesses 226a due to reduced aspect ratio of the plurality of trenches 222.

Still referring to FIG. 2E, following formation of the dielectric material 224 within and above the plurality of trenches 222, an annealing process is performed to increase the density of the dielectric material 224. This results in an interface between the liner layer and the dielectric material 224 that will disappear after the anneal process. The anneal process can be performed, for example, in a furnace, a rapid thermal process (RTP) system or other thermal system that is adapted to provide a thermal treatment for the dielectric material 224 to obtain a desired film quality. In some embodiments, the annealing process may be performed at about 1000° C. for about 20 seconds in a RTP system in an environment containing nitrogen, an inert gas or other gas that will not substantially react with the dielectric material 224.

FIG. 2F shows the substrate 202 of FIG. 2E after a planarization process, such as a chemical mechanical polishing (CMP) process, is performed to remove portions of the dielectric material 224 above the hardmask layer 206 to expose the hardmask layer 206, thereby leaving the dielectric material 224 filling the trenches 222. The hardmask layer 206 also serves as a stop layer for stopping the planarization process on the hardmask layer 206. In some embodiments, a top surface of the dielectric material 224 is or substantially coplanar with the hardmask layer 206. The plurality of the shallow slims 226b of the dielectric material 224 after the planarization process may become even shallower in depth and broader in width than the plurality of shallow slims 226a of the dielectric material 224 before the planarization process.

Referring to FIG. 2G, after the planarization process, the hardmask layer 206 has been removed by a wet chemical etching process, for example, by dipping the substrate 202 in hot phosphoric acid ($H_3PO_4$), exposing a top surface of the pad oxide layer 204. Because the wet chemical etching process has higher etch selectivity for nitride than to oxide, the etch process removes the hardmask layer 206 faster than the dielectric material 224. Accordingly, the remaining dielectric material 224 extends over a top surface of the pad oxide layer 204. Subsequent to the hardmask layer 206 removal process, the pad oxide layer 204 has been removed by a wet etching process, for example, by dipping the substrate 202 in hydrofluoric (HF), exposing the top surface of the substrate 202. Since the wet chemical etching process has almost no selectivity for the pad oxide layer 204 and the dielectric material 224, the dielectric material 224 may lose almost the same thickness as the pad oxide layer 204 does. Accordingly, the dielectric material 224 still protrudes over the top surface 210c of each fin structure 210 and each shallow slim recess 226c in the dielectric material 224 almost disappear.

FIG. 2H shows the substrate 202 of FIG. 2G after a dry etching process, for example, by etching the substrate 202 in a plasma comprising tetrafluormethane (CF4) and trifluormethane (CHF3), is performed to remove upper portions of the dielectric material 224 to expose the upper portion 210a of each fin structure 210. The fin structure could also form part of other devices, such as resistors, capacitors, inductors, fuses, etc. Accordingly, at the end of the etching process, the dielectric material 224 made has almost no recess and serves as the isolation structures 220 between the semiconductor devices. Each isolation structure 220 extends from the substrate surface 202a to a point 224a above the transition location 201d. A third offset distance 216c between the point 224a of the isolation structure 220 and the top surface 210c should be well controlled. If the third offset distance 216c between the point 224a of the isolation structure 220 and the top surface 210c is too small, shallow slims/recesses may still remain on the point 224a of the isolation structure 220. If the third offset distance 216c between the point 224a of the isolation structure 220 and the top surface 210c is too large, short channel effects may degrade device performance. Accordingly, in some embodiments, the third offset distance 216c between the point 224a of the isolation structure 220 and the top surface 210c is preferably in the range of about 15 to 45 nanometers. In some embodiments, the ratio of the third offset distance 216c between the point 224a of the isolation structure 220 and the top surface 210c to the first offset distance 216b between the transition location 210d and the top surface 210c to is preferably from 0.3 to 0.6. FIG. 2I shows a perspective view of the FINFETs 200 fabricated using the steps shown in FIG. 2A-H. Each fin structure 210 extends in a longitudinal direction 210g. As previously described the isolation structure 220 in FIG. 2I has no recesses.

Figure 3A:
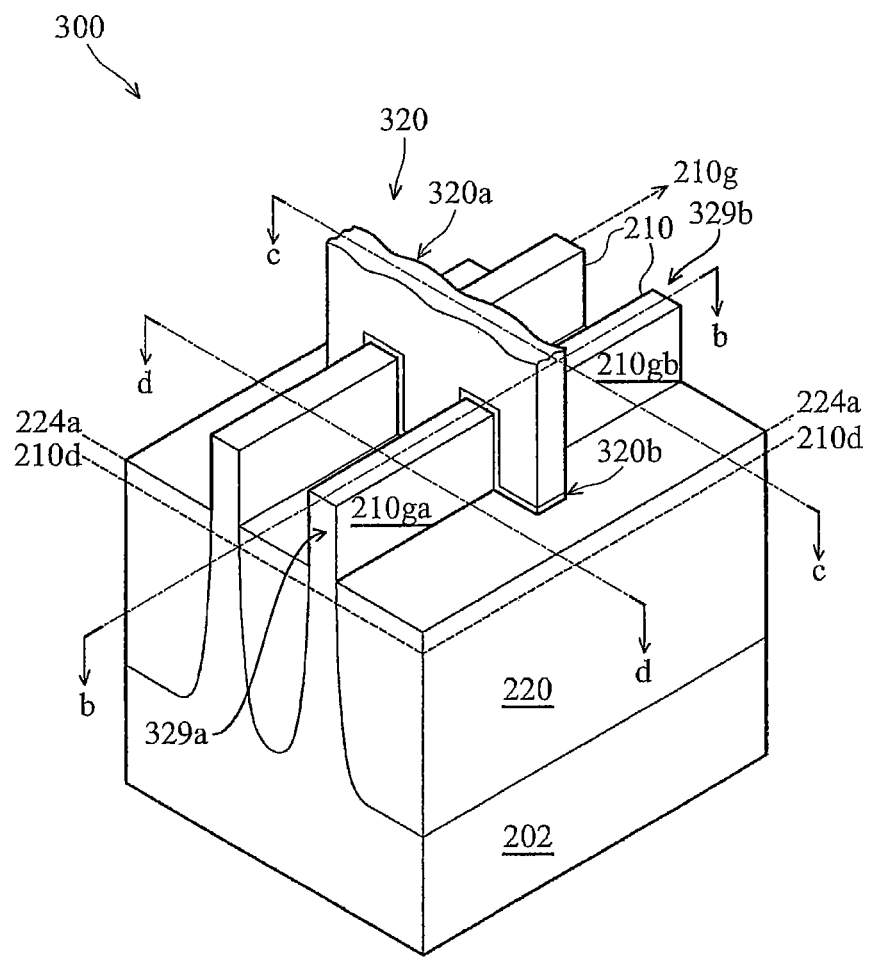
Figure 3B:
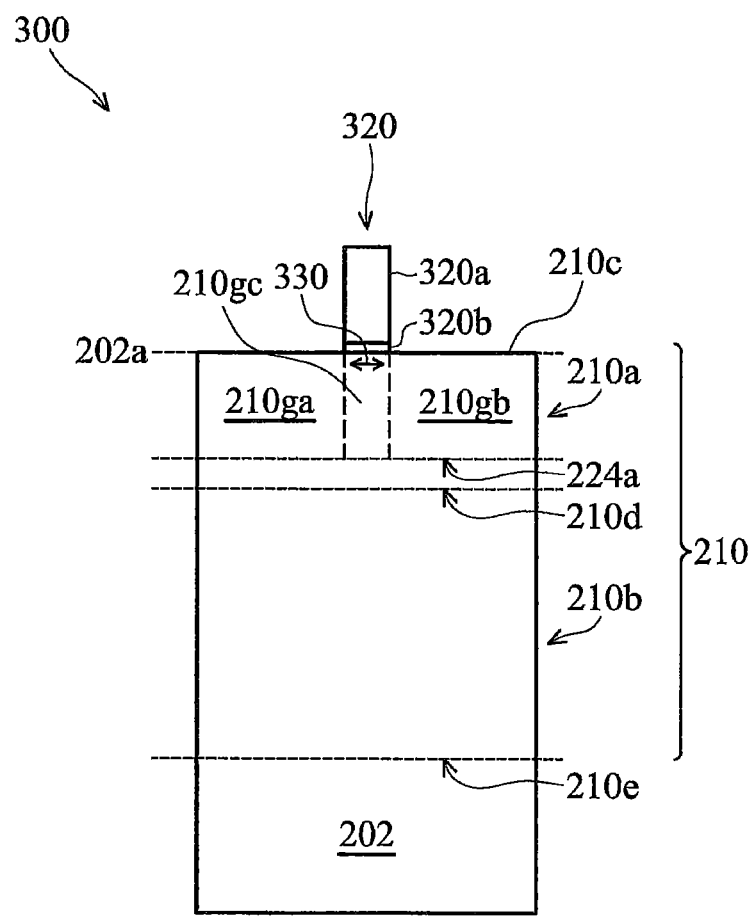
Figure 3C:
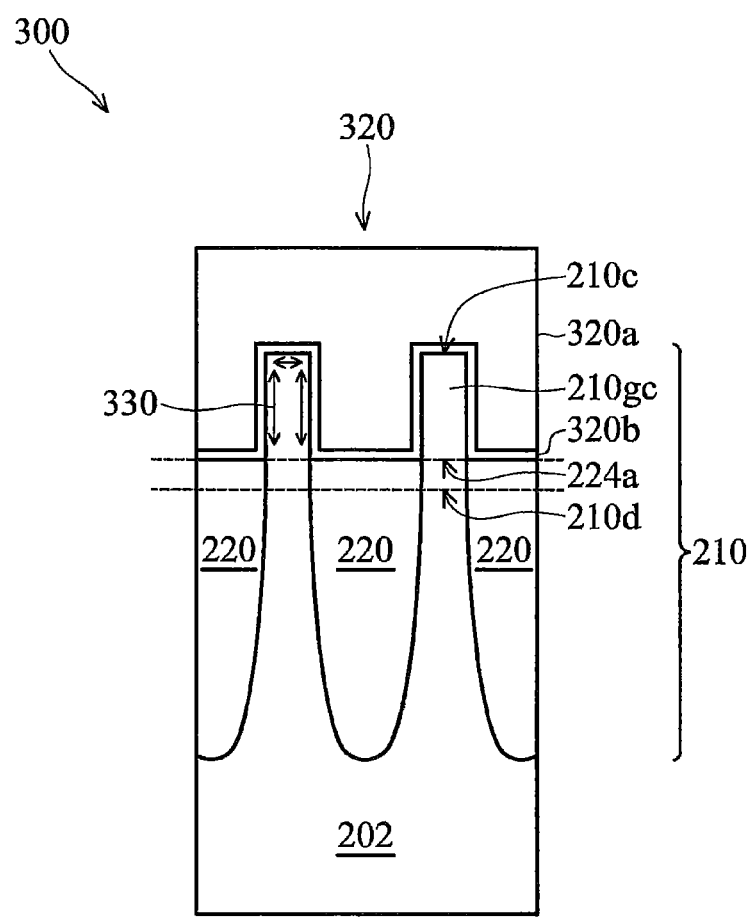
Figure 3D:
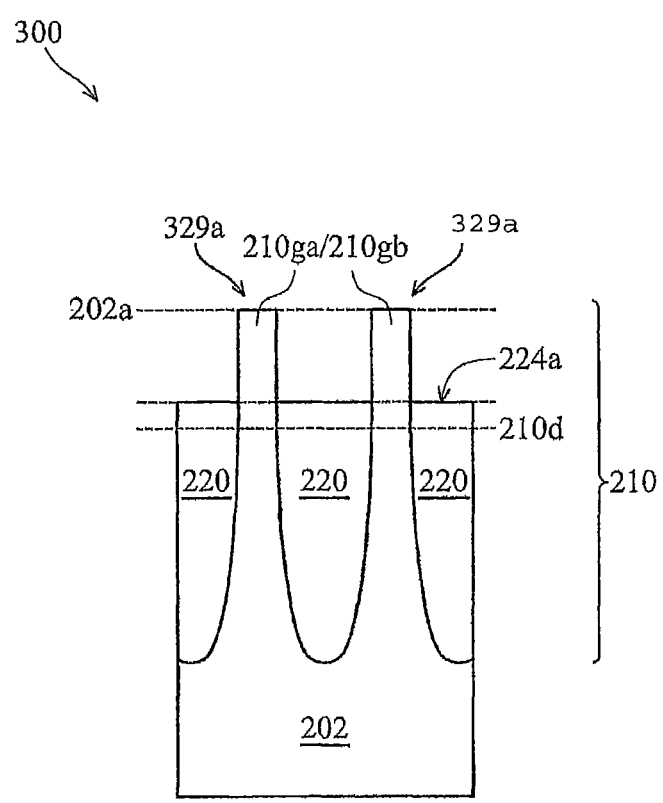

FIG. 3A-D shows a complete FINFET device 300 having a plurality of isolation structures 220 fabricated using the steps shown in FIG. 2A-H, wherein FIG. 3A shows a perspective view, and wherein FIGS. 3B-D show cross-ssection views taken along the respective lines of FIG. 3A. Similar features in FIGS. 2 and 3 are numbered the same for the sake of simplicity and clarity.

Referring to FIG. 3A, the FINFET 300 includes the plurality of fin structures 210 separated by the plurality of isolation structures 220. Each fin structure 210 extends in a longitudinal direction 210g. A gate structure 320 comprising a gate electrode 320a and a gate insulator 320b is disposed over the fin structures 210. FIG. 3A also illustrates the source/drain regions 330a, 330b, 329a and 329b of the FINFET 300.

FIG. 3B illustrates a cross-sectional view of the FINFET 300 taken along the line b-b of FIG. 3A. Each fin structure 210 extending in a longitudinal direction 210g comprises an upper portion 210a and a lower portion 210b separated at a transition location 210d at where the sidewall of the fin structure 210 at an angle of 85 degrees to the major surface 202a of the substrate 202, the upper portion 210a has sidewalls that are substantially perpendicular to the major surface 202a of the substrate 202 and a top surface 210c, the upper portion 210a comprises a first longitudinal portion 210ga, a second longitudinal portion 210gb, and a third longitudinal portion 210gc disposed between the first and the second longitudinal portions 210ga, 219gb. A channel region 330 is defined within the third longitudinal portion 210gc of the upper portion 210a. A gate structure 320 comprising a gate electrode 320a and a gate insulator 320b may be disposed over the channel region 330. A silicide layer (not shown) may be disposed within the first and the second longitudinal portions 210ga, 219gb form source/drain regions in the FINFET 300. The lower portion 210b under the upper portion 210a has a base 210e and bottom-up tapered sidewalls.

Referring to the cross sectional view of FIG. 3C taken along the line c-c of FIG. 3A, the gate structure 320 comprises the gate electrode 320a and the gate insulator 320b. The gate electrode 320a is disposed over the gate insulator 320b. If the thickness of the gate insulator 320b is uniform on all the surfaces of the fin structures 210, a triple gate transistor is formed. The channel 330 of the triple gate transistor is disposed under the gate structure 320 and within the top surface 210c and sidewalls of the third longitudinal portion 210gc of the upper portion 210a of the fin structures 210. However, in some embodiments, an additional dielectric layer (not shown) may be formed over the top surface 210c of the third longitudinal portion 210gc of the upper portion 210a before or after forming the gate insulator 310, the channel 330 of the FINFET 300 is formed only along the sidewalls of the third longitudinal portion 210gc, forming a double gate transistor.

FIG. 3D illustrates a cross-sectional view of the FINFET 300 taken along the line d-d of FIG. 3A. The fin structures 210 disposed between the isolation structures 220 are extending in a longitudinal direction 210g and continuous pieces of the underlying substrate 202. In some embodiments, the fin structures 210 may be separated from the substrate 202 by an insulation layer (not shown). In some embodiments, the first and the second longitudinal portions 210ga, 210gb of the upper portion 210a of the fin structures 210 comprise dopant-rich regions (not shown), and a silicide layer (not shown) may be disposed within the first and the second longitudinal portions 210ga, 210gb forming source/drain regions 329a and 329b in the FINFET 300. In various embodiments, the thickness of the dopant-rich regions is about 0.5 nm to about 10 nm. Then, subsequent processes, including interconnect processing, must be performed after forming the FINFET 300 to complete the IC fabrication.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements. The invention can be used to form or fabricate a fin structure for a FINFET having no isolation recess.

What is claimed is:

1. A semiconductor device comprising:
   a first fin structure extending from a first substrate surface of a substrate and having a planar top surface extending between two opposing sidewalls wherein each sidewall has a first portion and a second portion, the second portion below and contiguous with the first portion, and wherein the first portion is perpendicular to the first substrate surface, and the second portion being disposed at an angle between 85 degrees and 60 degrees from the first substrate surface and wherein the second portion is further curved proximate the first substrate surface such that a slope of the second portion continually decreases from a transition location with the first portion to the first substrate surface, and wherein a ratio of a first distance from the transition location to the planar top surface of the first fin structure and a second distance from the first substrate surface at a base of the first fin structure to the planar top surface of the first fin structure is from about 0.13 to 0.3, and wherein the first portion is doped forming a source/drain region; and
   an isolation structure having a top surface, the isolation structure being positioned between the first fin structure and an adjacent second fin structure, and wherein the top surface of the isolation structure is disposed above the transition location.

2. The semiconductor device of claim 1, wherein the first fin structure includes a third portion above the first portion and extending from the first portion to the planar top surface of the first fin structure.

3. The semiconductor device of claim 1, wherein the first fin structure has a first width at the planar top surface, and the first width is in a range of about 5 nanometers to about 40 nanometers.

4. The semiconductor device of claim 1, wherein the first fin structure has a first width at the planar top surface, a second width proximate to the first substrate surface, and a ratio of the first width to the second width is from about 0.3 to about 0.5.

5. The semiconductor device of claim 1, wherein the first distance from the transition location to the planar top surface of the first fin structure is in a range of about 40 nanometers to about 100 nanometers.

6. The semiconductor device of claim 5, wherein the second distance between the base of the first fin structure and the planar top surface of the first fin structure is in a range of about 100 nanometers to about 300 nanometers.

7. The semiconductor device of claim 1, wherein a third distance from the top surface of the isolation structure to the planar top surface of the first fin structure is in a range of about 15 nanometers to about 45 nanometers.

8. The semiconductor device of claim 1, further comprising: a gate structure on the top surface of the isolation structure and over the first fin structure adjacent the source/drain region.

9. A fin field effect transistor comprising:
   a fin structure extending above a substrate surface, the fin structure comprising sidewalls, the sidewalls comprising:

a first portion having a linear top surface interfacing a gate structure;

a second portion below the first portion, the second portion having a first sidewall portion that is perpendicular to the substrate surface and extending from the first portion of the fin structure to a transition location; and a third portion below and contiguous with the second portion, the third portion having a second sidewall portion that is curved with a continuously decreasing slope that extends from a first direct interface with the first sidewall portion at the transition location to a second direct interface with a curved sidewall of an adjacent fin structure, wherein the second sidewall portion and another sidewall of the adjacent fin structure provide a continuous curvilinear surface from the transition location to the adjacent fin structure;

a channel region within the first portion of the fin structure;

a doped region in the first portion of the fin structure forming source/drain regions including the linear top surface;

the gate structure over the channel region; and an isolation structure having a top surface adjacent to the fin structure, and wherein the isolation structure interfaces the transition location.

10. The fin field effect transistor of claim 9, wherein the second portion of the fin structure has a substantially constant width.

11. The fin field effect transistor of claim 10, wherein the substantially constant width is in a range of about 5 nanometers to about 40 nanometers.

12. The fin field effect transistor of claim 9, wherein the top surface of the isolation structure is above the transition location.

13. The fin field effect transistor device of claim 9, wherein a ratio of a distance from the transition location and a top surface of the channel region to another distance between the substrate surface and the top surface of the channel region is between about 0.13 and 0.3.

14. The fin field effect transistor of claim 9, wherein the isolation structure includes a liner layer of dielectric material.

15. A semiconductor device comprising:
a substrate having a first substrate surface and a second substrate surface parallel to the first substrate surface;
at least two fin structures between the first substrate surface and the second substrate surface, the at least two fin structures comprising sidewalls, the sidewalls comprising:

an upper portion proximate to the first substrate surface having a first sidewall portion interfacing a gate structure formed thereon wherein the first sidewall portion interfaces a second sidewall portion and a planar top surface of the upper portion interfacing the gate structure, a middle portion below the upper portion, the middle portion having the second sidewall portion that is substantially perpendicular to the first substrate surface and interfaces an isolation structure; and a lower portion proximate the second substrate surface, the lower portion having a third sidewall portion that is curved with a continuously decreasing slope, and wherein the curved third sidewall portion with the continuously decreasing slope extends an entirety of a distance from a transition location with the second sidewall portion of the middle portion to a midpoint of the second substrate surface, the transition location being a position at which the second sidewall portion and the third sidewall portion meet and the midpoint being disposed on the second substrate surface between the at least two fin structures; and the isolation structure extending between the at least two fin structures; and the first, second and third sidewall portions extend continuously from the first substrate surface to the second substrate surface and wherein a ratio of a distance from the transition location and the first substrate surface to another distance between the second substrate surface and the first substrate surface is between about 0.13 and 0.3.

16. The semiconductor device of claim 15, wherein the middle portion has a substantially constant width.

17. The semiconductor device of claim 15, wherein the isolation structure interfaces the middle portion and the lower portion.

18. The semiconductor device of claim 15, wherein a top surface of the isolation structure is above the transition location.

19. The semiconductor device of claim 15, wherein the third sidewall portion of the lower portion has a slope of between 85 degrees and 60 degrees.

20. The semiconductor device of claim 15, wherein the transition location is an upper most point on the lower portion that has a slope of 85 degrees with respect to the first substrate surface.

* * * * *